(12) United States Patent
Cheng et al.

(10) Patent No.: US 11,362,193 B2
(45) Date of Patent: Jun. 14, 2022

(54) INVERSE T-SHAPED CONTACT STRUCTURES HAVING AIR GAP SPACERS

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Heng Wu, Guilderland, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/662,446

(22) Filed: Oct. 24, 2019

(65) Prior Publication Data

US 2020/0058759 A1 Feb. 20, 2020

Related U.S. Application Data

(62) Division of application No. 15/965,264, filed on Apr. 27, 2018, now Pat. No. 10,522,649.

(51) Int. Cl.
*H01L 29/66* (2006.01)
*H01L 29/08* (2006.01)
*H01L 29/78* (2006.01)

(52) U.S. Cl.
CPC ...... *H01L 29/6653* (2013.01); *H01L 29/0847* (2013.01); *H01L 29/6656* (2013.01);
(Continued)

(58) Field of Classification Search
CPC .......... H01L 29/6653; H01L 29/66553; H01L 29/6656; H01L 29/66795; H01L 29/785
(Continued)

(56) References Cited

U.S. PATENT DOCUMENTS 5,952,677 A * 9/1999 Park .................. H01L 29/66765
257/66
6,506,653 B1 1/2003 Furukawa et al.
(Continued)

OTHER PUBLICATIONS

A. B. Sachid et al., "FinFET With Encased Air-Gap Spacers for High-Performance and Low-Energy Circuits," IEEE Electron Device Letters, vol. 38, No. 1, 2017, pp. 16-19.
(Continued)

*Primary Examiner* — Nduka E Ojeh
(74) *Attorney, Agent, or Firm* — Cantor Colburn LLP; Samuel Waldbaum (57) ABSTRACT

A method of fabricating air gap spacers is provided. The method includes forming gate structures to extend upwardly from a substrate with source or drain (S/D) regions disposed between the gate structures and with contact trenches defined above the S/D regions and between the gate structures. The method further includes disposing contacts in the contact trenches. The method also includes configuring the contacts to define open-ended air gap spacer trenches with the gate structures. In addition, the method includes forming a cap over the open-ended air gap spacer trenches to define the open-ended air gap spacer trenches as air gap spacers. The gate structures have an initial structure prior to and following the disposing and the configuring of the contacts and prior to and following the forming of the cap.

12 Claims, 3 Drawing Sheets

(52) U.S. Cl.
CPC .. *H01L 29/66553* (2013.01); *H01L 29/66795* (2013.01); *H01L 29/785* (2013.01)

(58) Field of Classification Search
USPC .......................................... 257/288; 438/421
See application file for complete search history.

(56) References Cited

U.S. PATENT DOCUMENTS

| | | | |
|---|---|---|---|
| 8,637,384 B2 | 1/2014 | Ando et al. | |
| 9,252,233 B2 | 2/2016 | Hsiao et al. | |
| 9,362,355 B1 | 6/2016 | Cheng et al. | |
| 9,515,156 B2 | 12/2016 | Besser et al. | |
| 9,716,158 B1 | 7/2017 | Cheng et al. | |
| 9,721,897 B1 | 8/2017 | Cheng et al. | |
| 9,859,166 B1 | 1/2018 | Cheng et al. | |
| 10,395,991 B2* | 8/2019 | Hsu | H01L 21/823475 |
| 10,522,642 B2* | 12/2019 | Lee | H01L 29/4991 |
| 10,522,649 B2* | 12/2019 | Cheng | H01L 29/4991 |
| 2017/0162395 A1 | 6/2017 | Wu et al. | |
| 2018/0082953 A1* | 3/2018 | Bi | H01L 21/76816 |
| 2019/0172752 A1* | 6/2019 | Hsu | H01L 21/31144 |

OTHER PUBLICATIONS

C. H. Lee et al., "Oxygen potential engineering of interfacial layer for deep sub-nm EOT high-k gate stacks on Ge," International Electron Devices Meeting, IEDM, 2013, 2,5, 4 pages.

K. Cheng et al., "Air spacer for 10nm FinFET CMOS and beyond," International Electron Devices Meeting, IEDM, 2016, 17.1, 4 pages.

List of IBM Patents or Patent Applications Treated as Related; (Appendix P), Filed Oct. 24, 2019; 2 pages.

Kangguo Cheng et al., "Inverse T-Shaped Contact Structures Having Air Gap Spacers ", U.S. Appl. No. 15/965,264, filed Apr. 27, 2018.

* cited by examiner

INVERSE T-SHAPED CONTACT STRUCTURES HAVING AIR GAP SPACERS

DOMESTIC PRIORITY

This application is a divisional application U.S. application Ser. No. 15/965,264, titled "INVERSE T-SHAPED CONTACT STRUCTURES HAVING AIR GAP SPACERS", which was filed on Apr. 27, 2018. The entire disclosures of U.S. application Ser. No. 15/965,264 are incorporated herein by reference.

BACKGROUND

The present invention generally relates to wafer fabrication, and more specifically, to wafer fabrication operations that include the formation of inverse T-shaped source or drain contact structures having air gap spacers.

In contemporary semiconductor device fabrication processes, a large number of semiconductor devices, such as field effect transistors (FETs), are fabricated on a single wafer. Some non-planar transistor device architectures, such as fin-type field effect transistors (FinFETs), employ semiconductor fins and a gate structure wrapped around the sidewalls and top of a central portion of the fin. The portion of the fin that is under the gate structure functions as the channel, and the portions of the fin that are not under the gate structure function as the source and the drain regions. When a sufficient voltage is applied to the gate, the channel becomes conductive and allows current to flow from the source, through the channel to the drain. This current flow is in a direction that is substantially parallel to a major surface of a substrate on which the FinFET device is formed. In some FinFET configurations, raised source/drain (S/D) regions are epitaxially grown over the S/D portions of the fin to increase the S/D volume and provide a larger surface for forming the necessary S/D conductive contacts for the FinFET.

SUMMARY

Embodiments of the present invention are directed to a method of fabricating air gap spacers. A non-limiting example of the method of fabricating air gap spacers includes forming gate structures to extend upwardly from a substrate with source or drain (S/D) regions disposed between the gate structures and with contact trenches defined above the S/D regions and between the gate structures. The non-limiting example of the method of fabricating air gap spacers further includes disposing contacts in the contact trenches. The non-limiting example of the method of fabricating air gap spacers also includes configuring the contacts to define open-ended air gap spacer trenches with the gate structures. In addition, the non-limiting example of the method of fabricating air gap spacers includes forming a cap over the open-ended air gap spacer trenches to define the open-ended air gap spacer trenches as air gap spacers. The gate structures have an initial structure prior to and following the disposing and the configuring of the contacts and prior to and following the forming of the cap.

Embodiments of the present invention are directed to a wafer fabrication method. A non-limiting example of the wafer fabrication method includes depositing an oxide, which is non-resistant to a liquid, over gate structures and into source or drain (S/D) regions of a wafer. The non-limiting example of the wafer fabrication method further includes converting portions of the oxide at upper sections of the gate structures into a material, which is resistant to the liquid. In addition, the non-limiting example of the wafer fabrication method includes removing unconverted remainders of the oxide by exposure thereof to the liquid such that lower sections of the gate structures and the S/D regions are exposed and the portions of the oxide at the upper sections of the gate structures remain. The non-limiting example of the wafer fabrication method also includes lining the lower sections of the gate structures and the S/D regions and the portions of the oxide with a diffusion barrier, which serves as a barrier against diffusion of a conductive material.

Embodiments of the invention are directed to a wafer. A non-limiting example of the wafer includes gate structures extending upwardly from a substrate and source or drain (S/D) regions disposed between the gate structures. The non-limiting example of the wafer further includes a metal-doped oxide disposed over upper sections of the gate structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Although this specification includes a detailed description of an exemplary FinFET configuration, implementation of the teachings recited herein are not limited to a particular FinFET structure or integrated circuit (IC) architecture. Rather, embodiments of the present invention are capable of being implemented in conjunction with any other type of transistor device or IC architecture, now known or later developed, for which there is a need to form a conductive contact to a source or drain (S/D) of the transistor device.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, a typical wafer fabrication process applies a series of complex steps to a semiconductor wafer to define conductors, transistors, resistors and other electronic components on the semiconductor wafer. Transistors are formed in a variety of configurations. For example, FinFETs are non-planar transistor architectures that employ semiconductor fins and a gate structure wrapped around the sidewalls and top of a central portion of the fin. The portion of the fin that is under the gate structure functions as the channel, and the portions of the fin that are not under the gate structure function as the source and the drain regions. When a sufficient voltage is applied to the gate, the channel becomes conductive and allows current to flow from the source, through the channel to the drain. This current flow is in a direction that is substantially parallel to a major surface of a substrate on which the FinFET device is formed. In some FinFET configurations, raised source/drain (S/D) regions are epitaxially grown over the S/D portions of the fin to increase the S/D volume and provide a larger surface for forming the necessary conductive contacts on the FinFET S/D. The S/D contacts are formed on either side of the gate structure. The gate structure includes a conductive gate material, such as copper, which is bound at its lower portion by a high-k dielectric material and at its upper portion by a dielectric liner. The S/D contacts are isolated from the gate structure by the dielectric liner and an air gap spacer defined within an area bound by the dielectric liner.

The presence of the air gap spacer effectively allows for a reduction in a resistivity of the conductive material in the gate and a reduction in parasitic capacitance between the gate and the S/D contacts. However, known air gap fabrication processes incorporate spacer and self-aligned cap removal processes, which expose work function metal (WFM) and the high-k dielectric material of the gate structure to plasma that damages the gate structure. As a result, various performance characteristics of the FinFET are downgraded.

Turning now to an overview of the aspects of the invention, one or more embodiments of the invention address the above-described shortcomings of the prior art by providing for the formation of partial air gaps in wafer elements using an inverse T-shaped S/D contact and liner structure, which makes it possible to avoid exposure of gate structure features to plasma that might otherwise damage those features.

The above-described aspects of the invention address the shortcomings of the prior art by forming the partial air gaps using processes other than plasma-based processes and then capping the partial air gaps once they are formed.

Figure 1:
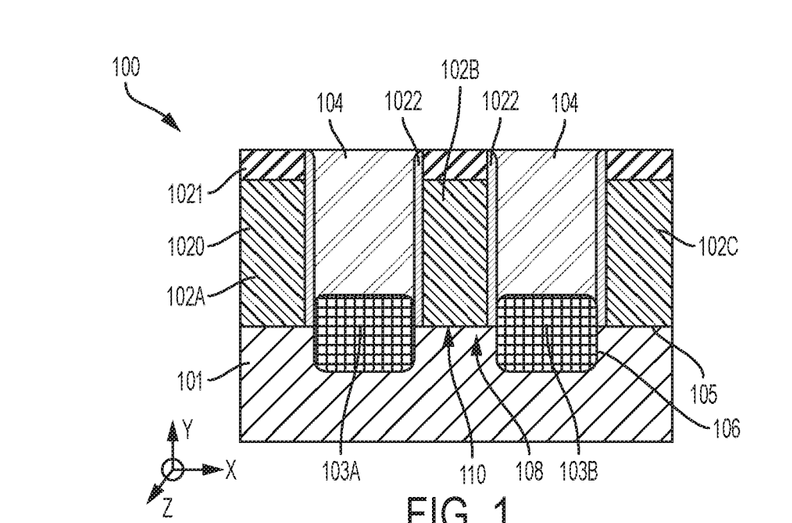
FIG. 1 depicts a wafer element including a substrate, gate structures extending upwardly from the substrate and dielectric material and source or drain (S/D) regions disposed between the gate structures in accordance with embodiments.

Turning now to a more detailed description of aspects of the present invention, FIGS. 1-9 depict a wafer element 100 after various fabrication operations for forming inverse t-shaped contact structures in accordance with aspects of the present invention. In FIG. 1, known fabrication operations have been used to form a wafer element 100 on which various FinFET devices are formed. As previously noted herein, although this specification includes a detailed description of an exemplary FinFET configuration, implementation of the teachings recited herein are not limited to a particular FinFET structure or integrated circuit (IC) architecture. Rather, embodiments of the present invention are capable of being implemented in conjunction with any other type of transistor device or IC architecture, now known or later developed, for which there is a need to form a conductive contact to a source or drain (S/D) of the transistor device. For example, the teachings used herein could be used to form the conducting contacts to the bottom S/D of a vertical FET (VFET) architecture.

For ease of illustration and explanation, FIGS. 1-9 depict two-dimensional (2D) cross-sectional views of several FinFET devices coupled together in series. The various elements that form the FinFET devices extend along a first axis (e.g., a horizontal X-axis) to define width dimensions, and extend along a second axis (e.g., a vertical Y-axis) perpendicular to the X-axis to define height (or thickness) dimensions. Although not specifically depicted in the 2D cross-sectional views shown in FIGS. 1-9, in accordance with standard FinFET architectures, the various elements that form the depicted FinFET devices also extend along a third axis (e.g., a Z-axis extending into the page) perpendicular to the first axis and the second axis to define depth dimensions. Thus, the various elements of the depicted FinFETs extend in the X, Y, and Z directions.

The wafer element 100 depicts what will become one complete FinFET device (i.e., a gate structure 102B positioned between two S/D regions 103A, 103B) and portions of two other FinFET devices (e.g., gate structure 102A and gate structure 102C). In embodiments of the invention, the one FinFET device is coupled in series with the portions of the two other FinFET devices. In embodiments of the invention, the one FinFET device shares one or both of its S/D regions with either the upstream or the downstream serially connected FinFET device.

In FIG. 1, known fabrication operations have been used to form a wafer element 100 having the structures configured and arranged as shown. The one FinFET device of the wafer element 100 includes a substrate 101, the gate structure 102B, and S/D regions 103A, 103B. A channel region 108 of the one FinFET device is formed in the substrate 101 and is positioned below the gate structure 102B and between the S/D regions 103A, 103B. The gate structure 102A is the gate structure of a downstream serially coupled FinFET device (partially shown), and the gate structure 102C is the gate structure of an upstream serially coupled FinFET device (partially shown).

The wafer element 100 at this fabrication stage further includes a dielectric material filler 104. The substrate 101 can be formed of silicon or another suitable semiconductor material. The substrate 101 has an upper surface 105 and recesses 106, which are recessed from the upper surface 105. The gate structures 102A, 102B and 102C extend upwardly from the upper surface 105 of the substrate 101. The gate structures 102A, 102B and 102C each include gate material 1020, a dielectric material lid 1021 disposed over an upper surface of the gate material 1020 and dielectric material spacers 1022. The dielectric material lid 1021 can include or be formed of silicon nitride (SiN). The dielectric material spacers 1022 can include or be formed of silicon boron carbon nitride (SiBCN). The dielectric material spacers 1022 extend vertically along sidewalls of the gate material 1020 from the upper surface 105 of the substrate 101 to an upper surface of the dielectric material lid 1021. The S/D regions 103A, 103B are disposed in the recesses 106 such that upper portions thereof are disposed between lowermost portions of the gate structures 102A, 102B and 102C. The dielectric material filler 104 can include silicon dioxide (SiO$_2$) or another suitable material.

Initial formation of the gate structures 102A, 102B and 102C can be conducted or executed by way of replacement metal gate (RMG) processes and the initial formation of the S/D regions 103A, 103B can be conducted or executed by way of epitaxial growth processing. In any case, at an initial time, as shown in FIG. 1, the gate structures 102A, 102B and 102C have an initial structure 110. The initial structure 110 is characterized in that the dielectric material spacers 1022 extend vertically and substantially straight from the upper surface 105 of the substrate 101 to the upper surface of the dielectric material lid 1021.

Figure 2:
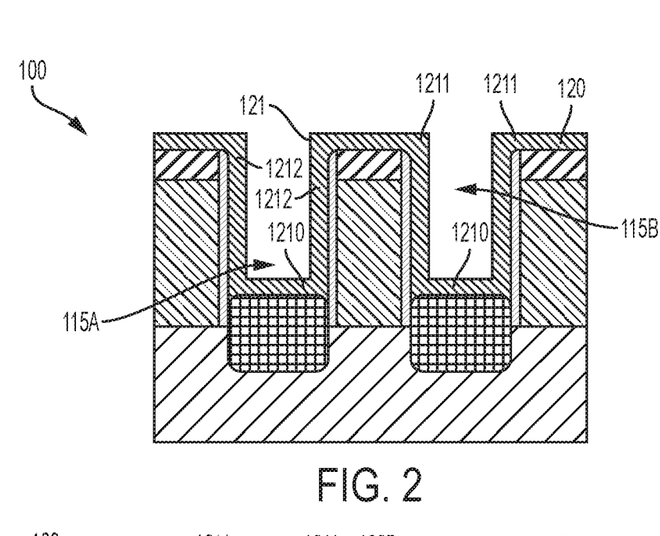
FIG. 2 depicts the wafer element of FIG. 1 with the dielectric material removed and an oxide deposited over the gate structures and the S/D regions in accordance with embodiments.

In FIG. 2, known semiconductor fabrication operations have been used to form initial S/D contact trenches 115A, 115B by removing the dielectric material filler 104 from the wafer element 100. An oxide 120 is conformally deposited over the gate structures 102A, 102B and 102C, inside the S/D contact trenches 115A, 115B and over the S/D regions 103A, 103B. The oxide 120 generally includes a material that is non-resistant to a liquid and, where the liquid is water, the oxide 120 can include or be provided as germanium oxide (GeO$_2$).

The deposition of the oxide 120 can be executed as a blanket conformal deposition and results in the oxide 120 forming an oxide layer 121 with lower portions 1210, upper portions 1211 and sidewall portions 1212. The lower portions 1210 lie over the S/D regions 103A, 103B. The upper portions 1211 lie over the dielectric material lids 1021. The sidewall portions 1212 extend along the dielectric material spacers 1022 from the lower portions 1210 to the upper portions 1211.

Figure 3:
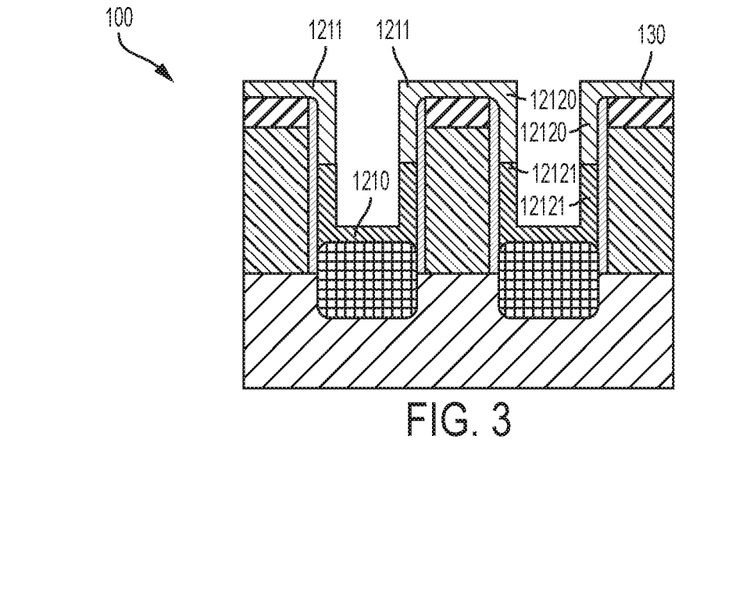
FIG. 3 depicts the wafer element of FIG. 2 with portions of the oxide having been converted into metal-doped oxide in accordance with embodiments.

FIG. 3 depicts the wafer element 100 of FIG. 2 with portions of the oxide 120 having been converted into metal-doped oxide 130 and remaining unconverted portions. The converted portions include the upper portions 1211 and upper portions of the sidewall portions 1212 (hereinafter referred to as "upper sidewall portions 12120"). The remaining unconverted portions include the lower portions 1210 and lower portions of the sidewall portions 1212 (hereinafter referred to as "lower sidewall portions 12121").

The conversion of the portions of the oxide 120 into the metal-doped oxide 130 can be executed as an ion implantation process or, more particularly, as an angled ion implantation process in which metallic ions, such as ions of yttrium (Y), scandium (Sc), aluminum (Al), etc., are implanted in the upper portions 1211 and the upper sidewall portions 12120. The angling of the angled ion implantation process serves to convert the upper portions 1211 and the upper sidewall portions 12120 into the metal-doped oxide 130 without similarly converting the lower portions 1210 or the lower sidewall portions 12121. The ion implantation angle can be defined in accordance with desired relative lengths of the upper and lower sidewall portions 12120 and 12121 as well as an accuracy (or lack thereof) of relatively high-angle ion implantation.

Figure 4:
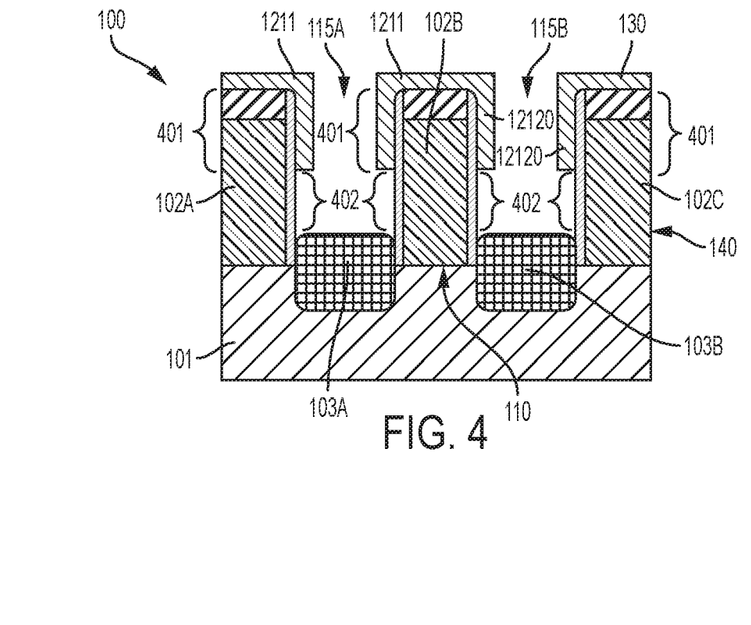
FIG. 4 depicts the wafer element of FIG. 3 with remaining unconverted portions of the oxide removed in accordance with embodiments.

FIG. 4 depicts the wafer element 100 of FIG. 3 with the remaining unconverted portions of the oxide 120 (e.g., the lower portions 1210 and the lower sidewall portions 12121 of FIG. 3) removed. The removal can be executed by exposure of the wafer element 100 to water or, more particularly, to deionized water. Because the lower portions 1210 and the lower sidewall portions 12121 are formed of a material that is non-resistant to water, such exposure causes the removal. By contrast, the metal-doped oxide 130 is water resistant and is not removed by the exposure.

As a result of the exposure of the wafer element 100 to water, the wafer element 100 can be provided as an intermediate structure 140. The intermediate structure 140 includes the substrate 101 as described above, the gate structures 102A, 102B and 102C as described above and the S/D contacts 103A, 103B as described above. The intermediate structure 140 further includes the metal-doped oxide 130 disposed over and along upper sections 401 of the gate structures 102A, 102B and 102C but not along lower sections 402 thereof or the S/D contacts 103A, 103B, which are thus exposed or re-exposed to atmospheric or ambient conditions. The gate structures 102A, 102B and 102C continue to have or to exhibit their initial structure 110, and the disposition of the metal-doped oxide 130 over and along the upper sections 401 results in the S/D contact trenches 115A, 115B having an inverted T-shape.

Figure 5:
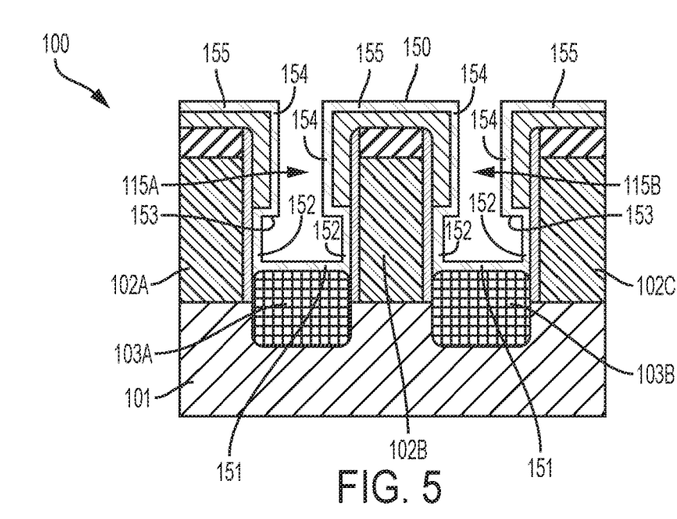
FIG. 5 depicts the wafer element of FIG. 4 following diffusion barrier deposition in accordance with embodiments.

FIG. 5 depicts the wafer element 100 of FIG. 4 following deposition of a diffusion barrier 150. The diffusion barrier 150 can include or be formed of materials that provide for a barrier against penetration by conductive materials, such as copper (Cu). The diffusion barrier 150 can include or be formed of tantalum nitride (TaN) or can be multi-layered with a layer of titanium nitride (TiN) or tungsten nitride (WN) and a layer of tantalum nitride (TaN).

The diffusion barrier 150 is thus deposited over the metal-doped oxide 130 and into the S/D contact trenches 115A, 115B. The diffusion barrier 150 includes lower sections 151 that cover the exposed S/D contacts 103A, 103B and lower sidewall sections 152 that extend along the lower sections 402 (see FIG. 4) of the gate structures 102A, 102B and 102C. The diffusion barrier 150 further includes terminal sections 153 that extend along terminal edges of the metal-doped oxide 130 and sidewall sections 154 and upper sections 155 that extend along the remaining surfaces of the metal-doped oxide 130.

As shown in FIG. 5, the lower sections 151, the lower sidewall sections 152, the terminal sections 153 and the sidewall sections 154 form the boundaries of the S/D contact trenches 115A, 115B at this stage of the fabrication process.

Figure 6:
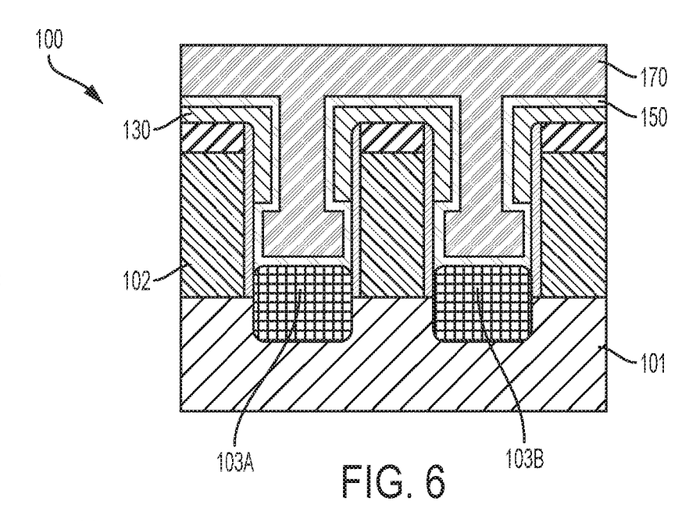
FIG. 6 depicts the wafer element of FIG. 5 following a conductive material filling operation in accordance with embodiments.

FIG. 6 depicts the wafer element 100 of FIG. 5 following a conductive material filling operation that results in conductive material 170 being filled into the contact trenches 115A, 115B (shown in FIG. 5). The conductive material 170 can be provided as copper (Cu) and the material of the diffusion barrier 150 thus prevents the conductive material 170 from diffusing outwardly.

Figure 7:
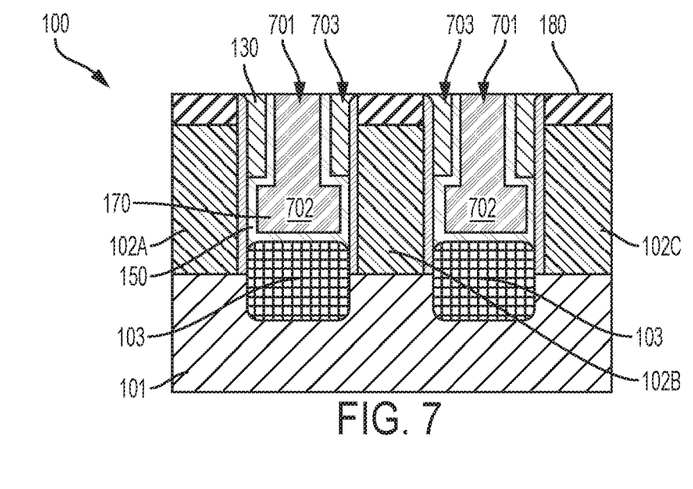
FIG. 7 depicts the wafer element of FIG. 6 following planarization in accordance with embodiments.

FIG. 7 depicts the wafer element 100 of FIG. 6 following planarization. The planarization can be conducted or executed as a chemical mechanical polishing (CMP) operation and planarizes an upper surface 180 of the conductive material 170, the diffusion barrier 150, the metal-doped oxide 130 and the gate structures 102A, 102B and 102C.

As shown in FIG. 7, the remainders of the conductive material 170 and the diffusion barrier 150 form lined contacts 701 between neighboring gate structures 102A, 102B and 102C and above the S/D regions 103A, 103B. The lined contact lines 701 are thus configured as a result of the processes described above to have or to exhibit inverse T-shaped cross-sections 702, which is complementary to (i.e., tracks) the T-shaped cross-sectional shape of the contact trenches 115A, 115B of FIGS. 4 and 5. The remaining portions of the metal-doped oxide 130 occupy precursor air gap spacer regions 703 and effectively define open-ended air gap spacer trenches 801 (shown in FIG. 8) between the lined contact lines 701 and the gate structures 102A, 102B and 102C.

Figure 8:
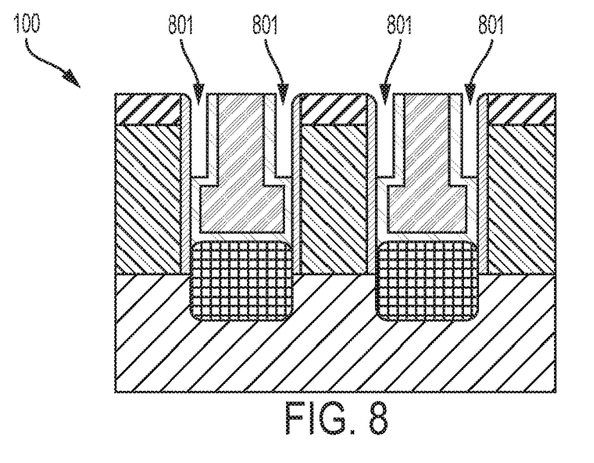
FIG. 8 depicts the wafer element of FIG. 7 following removal of the metal-doped oxide in accordance with embodiments.

FIG. 8 depicts the wafer element 100 of FIG. 7 following removal of the metal-doped oxide 130. Such removal can be conducted or executed by exposure of the metal-doped oxide to an ultrasonic deionized water wash or to an acidic solution, such as a relatively dilute hydrofluoric (HF) solution. The removal results in the formation of the open-ended air gap spacer trenches 801.

Figure 9:
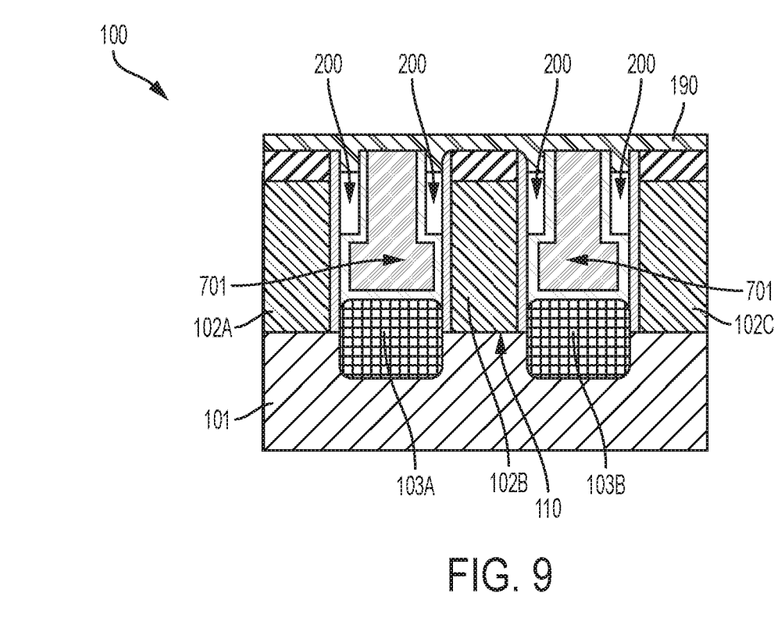
FIG. 9 depicts the wafer element of FIG. 8 following the formation of a cap in accordance with embodiments.

FIG. 9 depicts the wafer element 100 of FIG. 8 following the formation of a cap 190, which covers the open-ended air gap trenches 801 (shown in FIG. 8), thereby forming the air gap spacers 200. The cap 190 can include or be formed of silicon nitride (SiN) or silicon dioxide ($SiO_2$) and extends over the lined contact lines 701, the open-ended air gap spacer trenches 801 and the gate structures 102A, 102B and 102C.

By forming the air gap spacers 200 in accordance with embodiments of the invention, the gate structures 102A, 102B and 102C still retain or exhibit their initial structure 110. This is due to the fact that the air gap spacers 200 are defined as a result of the configuring of the lined contact lines 701 to have or to exhibit the inverse T-shaped cross sections 702 and the formation of the cap 190 as described above and without the use of plasma or plasma-based processing that would otherwise have damaged the gate structures 102A, 102B and 102C. The resulting wafer element 100 of FIG. 9 provides for characteristically non-degraded performance, reduced parasitic capacitance between the gate structures 102A, 102B and 102C and the S/D regions 103A, 103B, as well as reduced line resistance of the lined contact lines 701.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating air gap spacers, the method comprising:
    forming gate structures to extend from a substrate with source or drain (S/D) regions and contact trenches;
    disposing contacts in the contact trenches;
    configuring the contacts to comprise conductive material surrounded by a diffusion barrier and by shaping the contacts with an inverse T-shaped cross-section characterized with a central member having a first length from an upper end thereof to a lower end thereof and a first end-to-end thickness along an entirety of the first length and a distal member having a second length from an upper end thereof to a lower end thereof and a second end-to-end thickness that extends along an entirety of the second length and exceeds the first end-to-end thickness, the distal member being integrally connected at the upper end thereof to the lower end of the central member such that the contacts define open-ended air gap spacer trenches with the gate structures and a portion of the diffusion barrier surrounding the distal member extends across an entirety of a span between neighboring ones of the gate structures; and
    capping the open-ended air gap spacer trenches with a cap to define the open-ended air gap spacer trenches as air gap spacers,
    the gate structures having an initial structure prior to and following the disposing and the configuring of the contacts and prior to and following the capping and
    the cap being in contact with upper surfaces of the conductive material and the diffusion barrier and with exposed sides of the diffusion barrier along which protrusions of the cap extend wherein:
    the initial structure comprises a gate stack, a dielectric material lid and dielectric material spacers, and
    the portion of the diffusion barrier surrounding the distal member extends between dielectric material spacers of the neighboring ones of the gate structures and abuts with the dielectric material spacers of the neighboring ones of the gate structures along entire respective heights thereof.

2. The wafer fabrication method according to claim 1, wherein the gate structures each have a same initial structure prior to the disposing and the configuring of the contacts and the capping.

3. The wafer fabrication method according to claim 2, wherein the gate structures each have the same initial structure following the disposing and the configuring of the contacts and the capping.

4. The wafer fabrication method according to claim 1, wherein the dielectric material lid is disposed over the gate stack.

5. The wafer fabrication method according to claim 4, wherein the dielectric material spacers extend from the substrate to an upper surface of the dielectric material lid.

6. A method of fabricating air gap spacers, the method comprising:
    forming gate structures to extend upwardly from a substrate with source or drain (S/D) regions disposed between the gate structures and with contact trenches defined above the S/D regions and between the gate structures;
    disposing contacts in the contact trenches;
    configuring the contacts to comprise conductive material surrounded by a diffusion barrier and by shaping the contacts with an inverse T-shaped cross-section characterized with a central member having a first length from an upper end thereof to a lower end thereof and a first end-to-end thickness along an entirety of the first length and a distal member having a second length from an upper end thereof to a lower end thereof and a second end-to-end thickness that extends along an entirety of the second length and exceeds the first end-to-end thickness, the distal member being integrally connected at the upper end thereof to the lower end of the central member such that the contacts define open-ended air gap spacer trenches with the gate structures and a portion of the diffusion barrier surrounding the distal member extends across an entirety of a span between neighboring ones of the gate structures; and
    forming a cap over the open-ended air gap spacer trenches to define the open-ended air gap spacer trenches as air gap spacers,
    the gate structures having an initial structure prior to and following the disposing and the configuring of the contacts and prior to and following the forming of the cap, and
    the cap being in contact with upper surfaces of the conductive material and the diffusion barrier and with exposed sides of the diffusion barrier along which protrusions of the cap extend,
    wherein:
    the initial structure comprises a gate stack, a dielectric material lid and dielectric material spacers, and
    the portion of the diffusion barrier surrounding the distal member extends between dielectric material spacers of the neighboring ones of the gate structures and abuts with the dielectric material spacers of the neighboring ones of the gate structures along entire respective heights thereof.

7. The wafer fabrication method according to claim 6, wherein the gate structures each have a same initial structure prior to the disposing and the configuring of the contacts and the forming of the cap.

8. The wafer fabrication method according to claim 7, wherein the gate structures each have the same initial structure following the disposing and the configuring of the contacts and the forming of the cap.

9. The wafer fabrication method according to claim 6, wherein the dielectric material lid is disposed over the gate stack.

10. The wafer fabrication method according to claim 9, wherein the dielectric material spacers extend upwardly from the substrate to an upper surface of the dielectric material lid.

11. A method of fabricating air gap spacers, the method comprising:
forming gate structures to extend from a substrate with source or drain (S/D) regions and contact trenches;
disposing contacts in the contact trenches;
shaping the contacts to comprise conductive material surrounded by a diffusion barrier and to have an inverse T-shaped cross-section with a central member having a first length from an upper end thereof to a lower end thereof and a first end-to-end thickness along an entirety of the first length and a distal member having a second length from an upper end thereof to a lower end thereof and a second end-to-end thickness that extends along an entirety of the second length and exceeds the first end-to-end thickness, the distal member being integrally connected at the upper end thereof to the lower end of the central member such that the contacts define open-ended air gap spacer trenches with the gate structures and a portion of the diffusion barrier surrounding the distal member extends across an entirety of a span between neighboring ones of the gate structures; and
capping the open-ended air gap spacer trenches with a cap to define the open-ended air gap spacer trenches as air gap spacers,
the cap being in contact with upper surfaces of the conductive material and the diffusion barrier and with exposed sides of the diffusion barrier along which protrusions of the cap extend,
wherein:
the gate structures have an initial structure prior to and following the disposing and the configuring of the contacts and prior to and following the capping,
the initial structure comprises a gate stack, a dielectric material lid and dielectric material spacers, and
the portion of the diffusion barrier surrounding the distal member extends between dielectric material spacers of the neighboring ones of the gate structures and abuts with the dielectric material spacers of the neighboring ones of the gate structures along entire respective heights thereof.

12. The method according to claim 11, wherein:
the gate structures each have a same initial structure prior to the disposing and the configuring of the contacts and the capping, and
the gate structures each have the same initial structure following the disposing and the configuring of the contacts and the capping.

* * * * *